United States Patent
Yi et al.

(10) Patent No.: US 11,211,421 B2
(45) Date of Patent: Dec. 28, 2021

(54) SENSOR COMPRISING GATE MODULATION WITH INDUCTOR TO FORM A RESONANT CIRCUIT

(71) Applicant: OmniVision Technologies, Inc., Santa Clara, CA (US)

(72) Inventors: Xianmin Yi, Menlo Park, CA (US); Jingming Yao, San Jose, CA (US); Philip Cizdziel, San Jose, CA (US); Eric Webster, Mountain View, CA (US); Duli Mao, Sunnyvale, CA (US); Zhiqiang Lin, San Jose, CA (US); Jens Landgraf, Bloomfield Hills, MI (US); Keiji Mabuchi, Los Altos, CA (US); Kevin Johnson, Kildeer, IL (US); Sohei Manabe, San Jose, CA (US); Dyson H. Tai, San Jose, CA (US); Lindsay Grant, Campbell, CA (US); Boyd Fowler, Sunnyvale, CA (US)

(73) Assignee: OMNIVISION TECHNOLOGIES, INC., Santa Clara, CA (US)

(*) Notice: Subject to any disclaimer, the term of this patent is extended or adjusted under 35 U.S.C. 154(b) by 534 days.

(21) Appl. No.: 16/255,194

(22) Filed: Jan. 23, 2019

(65) Prior Publication Data
US 2020/0235158 A1   Jul. 23, 2020

(51) Int. Cl.
*G01S 17/89* (2020.01)
*H01L 27/146* (2006.01)
(Continued)

(52) U.S. Cl.
CPC ........ *H01L 27/14643* (2013.01); *G01S 17/10* (2013.01); *H01L 27/148* (2013.01);
(Continued)

(58) Field of Classification Search
CPC ......... H01L 27/14601; H01L 27/14609; H01L 27/14643; H01L 31/02027; H01L 31/107;
(Continued)

(56) References Cited

U.S. PATENT DOCUMENTS

| 4,495,655 A | 1/1985 | Benson et al. |
| 7,485,838 B2 * | 2/2009 | Nishi ........................ G01J 1/44 |
| | | 250/214 A |

(Continued)

FOREIGN PATENT DOCUMENTS

| TW | 201904085 | 1/2019 |
| WO | WO 2016/006047 A1 | 1/2016 |

OTHER PUBLICATIONS

Mohan et al., "Simple Accurate Expressions for Planar Spiral Inductances," IEEE Journal of Solid-State Circuits, vol. 34, No. 10, Oct. 1999, pp. 1419-1424.
(Continued)

*Primary Examiner* — Que Tan Le
(74) *Attorney, Agent, or Firm* — Christensen O'Connor Johnson Kindness PLLC

(57) ABSTRACT

A sensor includes a photodiode disposed in a semiconductor material to receive light and convert the light into charge, and a first floating diffusion coupled to the photodiode to receive the charge. A second floating diffusion is coupled to the photodiode to receive the charge, and a first transfer transistor is coupled to transfer the charge from the photodiode into the first floating diffusion. A second transfer transistor is coupled to transfer the charge from the photodiode into the second floating diffusion, and an inductor is coupled between a first gate terminal of the first transfer transistor and a second gate terminal of the second transfer transistor. The inductor, the first gate terminal, and the second gate terminal form a resonant circuit.

20 Claims, 4 Drawing Sheets

(51) Int. Cl.
    *H01L 31/107*     (2006.01)
    *H01L 31/02*     (2006.01)
    *H01L 27/148*     (2006.01)
    *G01S 17/10*     (2020.01)

(52) U.S. Cl.
    CPC .. *H01L 27/14601* (2013.01); *H01L 31/02027* (2013.01); *H01L 31/107* (2013.01); *G06T 2207/10028* (2013.01)

(58) Field of Classification Search
    CPC ...... G01S 17/10; G01S 7/4865; G01S 17/894; G01S 17/08; G06T 2207/10028
    USPC .................................. 250/214 R, 208.1, 239
    See application file for complete search history.

(56) References Cited

U.S. PATENT DOCUMENTS

| | | |
|---|---|---|
| 10,673,204 B2 | 6/2020 | Pavlov et al. |
| 2004/0075823 A1 | 4/2004 | Lewis et al. |
| 2016/0353084 A1 | 12/2016 | Sun et al. |

OTHER PUBLICATIONS (ROC) Taiwan Patent Application No. 108137490—Office Action with English Translation, dated Jul. 21, 2020, 7 pages.

\* cited by examiner

SENSOR COMPRISING GATE MODULATION WITH INDUCTOR TO FORM A RESONANT CIRCUIT

TECHNICAL FIELD

This disclosure relates generally to electronic devices, and in particular but not exclusively, relates to image sensors.

BACKGROUND INFORMATION

Interest in three dimensional (3D) cameras is increasing as the popularity of 3D applications continues to grow in areas such as imaging, movies, games, computers, user interfaces, facial recognition, object recognition, augmented reality, and the like. A typical passive way to create 3D images is to use multiple cameras to capture stereo or multiple images. Using the stereo images, objects in the images can be triangulated to create the 3D image. One disadvantage with this triangulation technique is that it is difficult to create 3D images using small devices because there must be a minimum separation distance between each camera in order to create the three dimensional images. In addition, this technique is complex and therefore requires significant computer processing power in order to create the 3D images in real time.

For applications that require the acquisition of 3D images in real time, active depth imaging systems based on time-of-flight measurements are sometimes utilized. Time-of-flight cameras typically employ a light source that directs light at an object, a sensor that detects the light that is reflected from the object, and a processing unit that calculates the distance to the objected based on the round-trip time it takes for the light to travel to and from the object.

A continuing challenge with the acquisition of 3D images is balancing the desired performance parameters of the time-of-flight camera with the physical size and power constraints of the system. For example, the power requirements of time-of-flight systems meant for imaging near and far objects may be considerably different. These challenges are further complicated by extrinsic parameters (e.g., desired frame rate of the camera, depth resolution and lateral resolution) and intrinsic parameters (e.g., quantum efficiency of the sensor, fill factor, jitter, and noise).

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
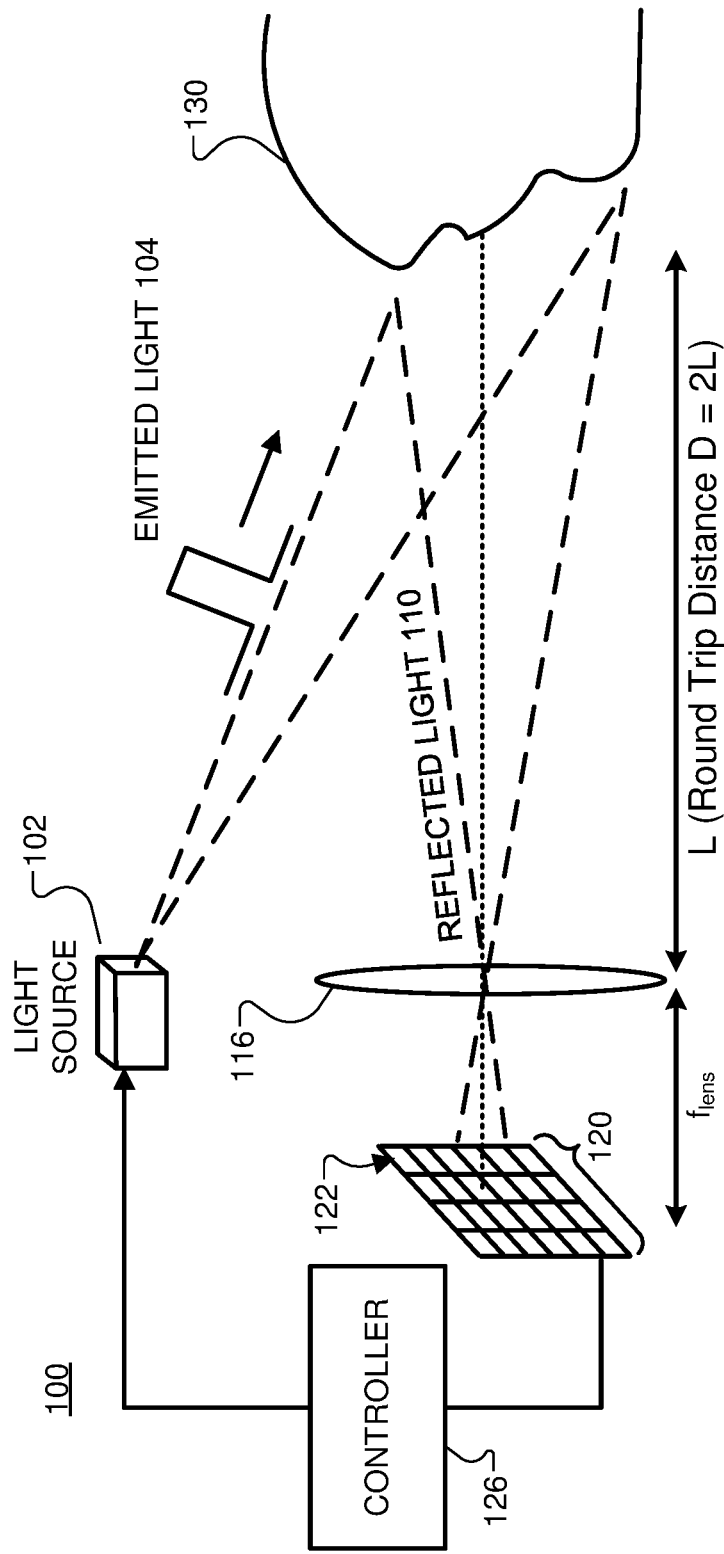
FIG. 1 is a diagram that shows one example of a time-of-flight (TOF) sensor, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of a system, apparatus, and method for gate modulation with an inductor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Some imaging time-of-flight (iTOF) sensors modulate gates in the device globally, at frequencies ranging from 10 MHz up to several 100 MHz. Sensor technologies may use gate modulation to transfer charge from the photodiode into the floating diffusion. Some sensors may use gate modulation to speed up charge transfer within the photodiode when the photodiode is large. However, gate modulation consumes a lot of power, especially when the gate capacitance is large, gate modulation speed is high, and/or the gate modulation voltage swing is large.

As will be shown, an example circuit in accordance with the teachings of the present disclosure includes two gates that are modulated at high frequencies. When one gate is turned on the other gate is turned off. An inductor is coupled in series between these two gates and utilizes LC oscillation (i.e., a resonant circuit) to recycle gate capacitance power when turning the gates on and off. Accordingly, in some examples it is helpful to reduce the resistance in the LC oscillator to improve efficiency. Using a pixel-level hybrid bond, flexibility is available for special designs and processes to reduce the resistance of the metal lines proposed in some examples.

The embodiments discussed above, and other embodiments, will be further described below as they relate to the figures.

FIG. 1 is a block diagram that shows one example of a time-of-flight system 100 in accordance with the teachings of the present disclosure. Time-of-flight system 100 includes light source 102, lens 116, plurality of pixels 120 (including first pixel 122), and controller 126 (which includes control circuitry, memory, counter device etc.). Controller 126 is coupled to light source 102, and plurality of pixels 120 (including first pixel 122). Plurality of pixels 120 is positioned at a focal length $f_{lens}$ from lens 116. As shown in the example, light source 102 and lens 116 are positioned at a distance L from object 130. It is appreciated that FIG. 1 is not illustrated to scale and that in one example the focal length $f_{lens}$ is substantially less than the distance L between lens 116 and object 130. Therefore, it is appreciated that for the purposes of this disclosure, the distance L and the distance L+focal length $f_{lens}$ are substantially equal for the purposes of time-of-flight measurements in accordance with the teachings of the present invention. As illustrated, plurality of pixels 120, and controller 126 are represented as separate components. However, it is appreciated that plurality of pixels 120 and controller 126 may all be integrated onto a same stacked chip sensor and may also include a time-to-digital converter (or a plurality of time-to-digital converters, with each pixel associated with a corresponding one of the plurality of time-to-digital converters). In other examples, plurality of pixels 120, and controller 126 may be integrated onto a non-stacked planar sensor. It is also appreciated that each pixel (or even each SPAD) may have a corresponding memory for storing digital bits or signals for counting detected photons.

Time-of-flight system 100 may be a 3D camera that calculates image depth information of a scene to be imaged (e.g., object 130) based on time-of-flight measurements with plurality of pixels 120. Each pixel in plurality of pixels 120 determines depth information for a corresponding portion of object 130 such that a 3D image of object 130 can be generated. Depth information is determined by measuring a round-trip time for light to propagate from light source 102 to object 130 and back to time-of-flight system 100. As illustrated, light source 102 (e.g., a vertical-cavity surface-emitting laser which may emit visible, infrared, or ultraviolet light) is configured to emit light 104 to object 130 over a distance L. Emitted light 104 is then reflected from object 130 as reflected light 110, some of which propagates towards time-of-flight system 100 over a distance L and is incident upon plurality of pixels 120 as light. Each pixel (e.g., first pixel 122) in plurality of pixels 120 includes a photodetector (e.g., one or more single-photon avalanche diodes (SPADs)) to detect the image light and convert the image light into an electric signal (e.g., charge).

As shown in the depicted example, the round-trip time for pulses of the emitted light 104 to propagate from light source 102 to object 130 and back to plurality of pixels 120 can be used to determine the distance L using the following relationships in Equations (1) and (2) below:

$$T_{TOF} = \frac{2L}{c} \quad (1)$$

$$L = \frac{T_{TOF} \times c}{2} \quad (2)$$

where c is the speed of light, which is approximately equal to $3 \times 10^8$ m/s, and $T_{TOF}$ corresponds to the round-trip time which is the amount of time that it takes for pulses of the light to travel to and from the object as shown in FIG. 1. Accordingly, once the round-trip time is known, the distance L may be calculated and subsequently used to determine depth information of object 130. Controller 126 is coupled to plurality of pixels 120 (including first pixel 122, which may be coupled to readout circuitry to read out charge and convert the charge to data which is indicative of the charge), and light source 102 and includes logic that when executed causes time-of-flight system 100 to perform operations for determining the round-trip time. Logic may include a capacitor that charges at a known rate, where charging begins when photons are emitted by light source 102 and stops when photons are received by array 120.

In some examples, time-of-flight sensor 100 is included in a handheld device (e.g., a mobile phone, a tablet, a camera, etc.) that has size and power constraints determined, at least in part, based on the size of the device. Alternatively, or in addition, time-of-flight system 100 may have specific desired device parameters such as frame rate, depth resolution, lateral resolution, etc. In some examples, time-of-flight sensor 100 is included in a LiDAR system.

Figure 2A:
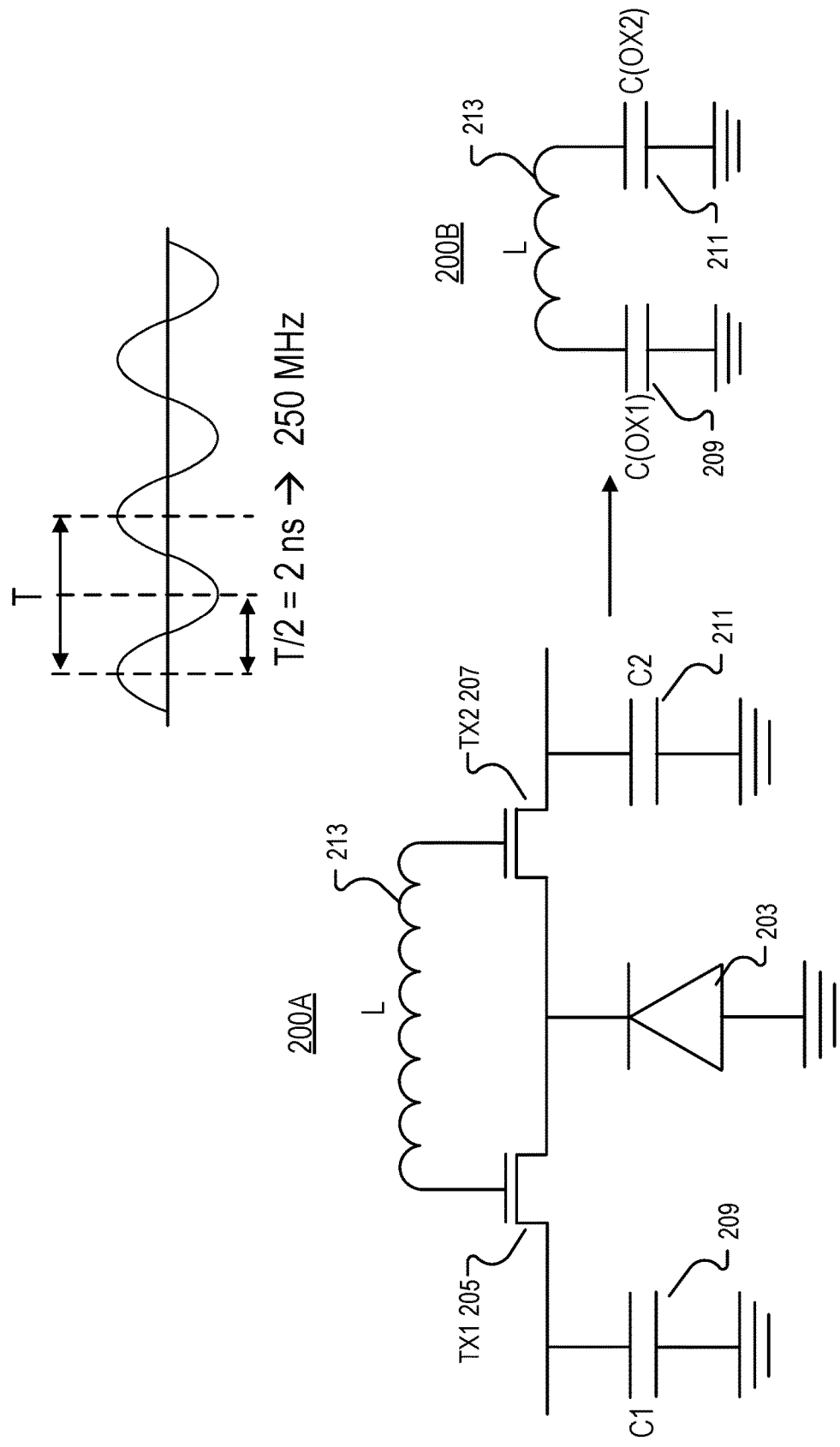
FIG. 2A shows an example circuit diagram for part of the TOF sensor of FIG. 1, in accordance with the teachings of the present disclosure.

FIG. 2A shows an example circuit diagram for part of the TOF sensor 200A of FIG. 1, in accordance with the teachings of the present disclosure. Circuit 200B is an equivalent circuit. As depicted, circuit 200A includes photodiode 203 (e.g., a single-photon avalanche photodiode (SPAD)), first transfer transistor 205, second transfer transistor 207, first floating diffusion 209 (e.g., a doped well in a semiconductor material), second floating diffusion 211 (e.g., a doped well in the semiconductor material), and inductor 213.

As shown, first floating diffusion 209 is coupled to photodiode 203 to receive the charge generated when photodiode 203 receives one or more photons. Second floating diffusion 211 is similarly coupled to photodiode 203 to receive the charge. First transfer transistor 205 is coupled to transfer the charge from photodiode 203 into first floating diffusion 209, and second transfer transistor 207 is coupled to transfer the charge from photodiode 203 into second floating diffusion 211. Inductor 213 is coupled between a first gate terminal of first transfer transistor 205 and a second gate terminal of second transfer transistor 207. In the depicted example, inductor 213 the first gate terminal of first transfer transistor 205 and the second gate terminal of second transfer transistor 207 form a resonant circuit. Accordingly, inductor 213 applies a first oscillating voltage to the first gate terminal and a second oscillating voltage to the second gate terminal. The first oscillating voltage applied to the first gate terminal may be 180 degrees out of phase from the second oscillating voltage applied to the second gate terminal. As stated above, using an inductor to recycle charge provided to the gate electrodes of transfer transistors may save an appreciable amount of sensor power since there may be many thousands of photodiodes and transfer transistors per chip.

Also shown is the equivalent circuit 200B to circuit 200A when the first and second transfer transistors 205/207 are turned on at their respective times. The oscillating frequency, $\omega_0$, of equivalent circuit is given by the equation:

$$\omega_0 = \sqrt{\frac{1}{L}\left(\frac{1}{C_1} + \frac{1}{C_2}\right)} \quad (3)$$

where $\omega_0$ is the oscillating frequency, L is inductance, and $C_1$ and $C_2$ are capacitances of the two capacitors C(OX1) and C(OX2), respectively (which are the junction capacitance of the two transfer gates). In various examples, the values for the variables above may be designed such that the oscillating frequency may be greater than 100 MHz (e.g., 250 MHz).

Figure 2B:
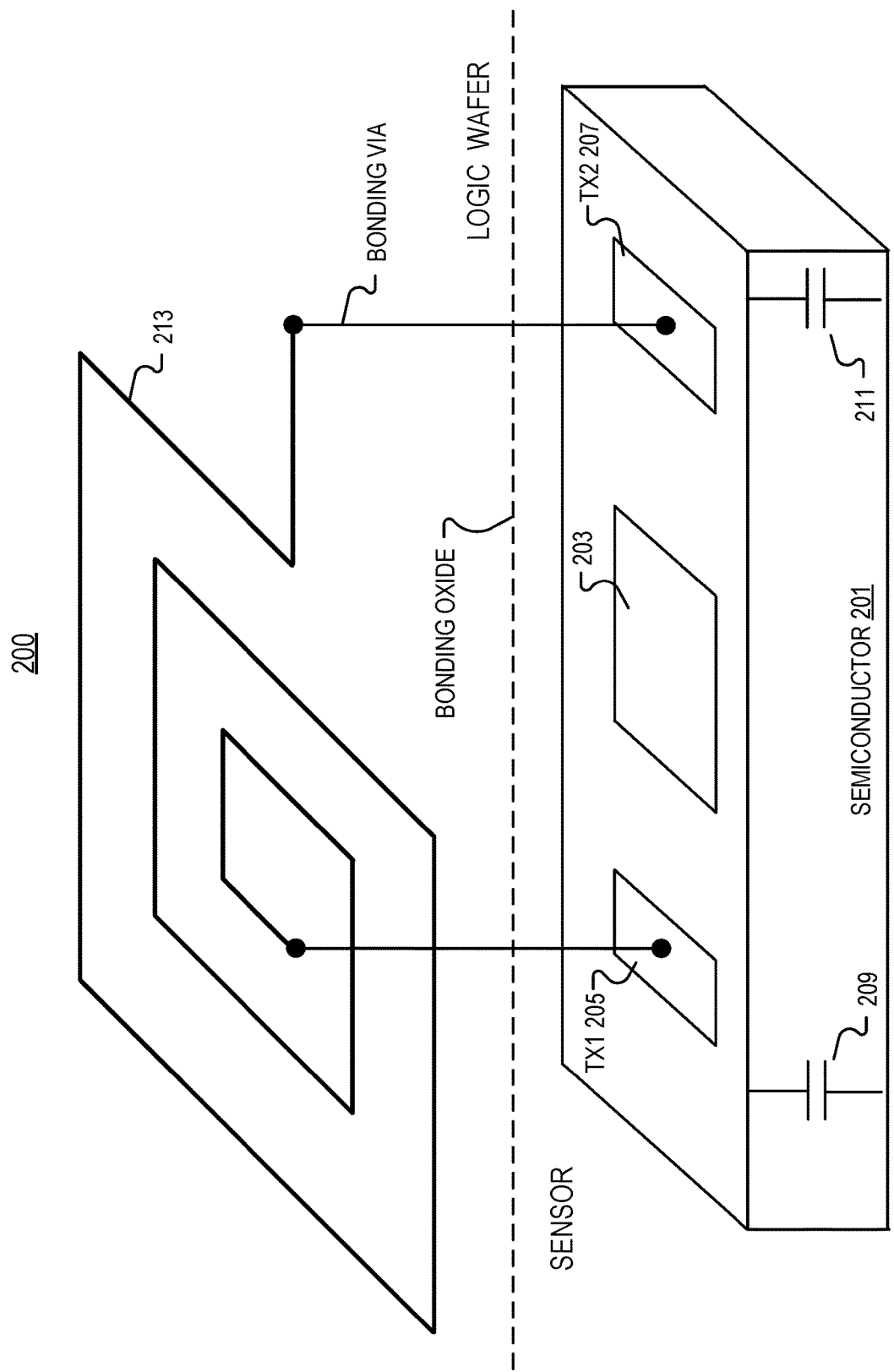
FIG. 2B shows an example schematic for part of the circuit diagram of FIG. 2A, in accordance with the teachings of the present disclosure.

FIG. 2B shows an example schematic for part of the circuit diagram of FIG. 2A, in accordance with the teachings of the present disclosure. In the depicted example, photodiode 203, the active region of first transfer transistor 205, the active region of second transfer transistor 207, first floating diffusion 209, and second floating diffusion 211 are disposed in semiconductor material 201 (e.g., silicon). Photodiode 201 is positioned in semiconductor material 201 to absorb light and generate charge in response to the light.

As illustrated, inductor 213 is disposed in a logic wafer (e.g., containing one or more metal layers), and the logic wafer is coupled to a non-illuminated side of semiconductor material 201. Inductor 213 may be coupled to the gate electrodes with bonding vias that extends from the logic wafer through a bonding oxide to semiconductor material 201. As shown, inductor 213 may include a metal coil that is substantially planar, and the metal coil forms concentric substantially rectangular shapes. However, in other examples, the metal coil can take other shapes that are not necessarily rectangular such as circular, hexagonal or the like. Additionally, in some examples, the metal (e.g., copper, aluminum, silver, or the like) may not include a single planar coil, but many coils in different planes in the logic wafer.

In one example, we may assume that $C_{ox}$ (TX)=5e-8 F/cm$^2$ (where the dielectric constant, k=4, the gate oxide thickness is approximately=70 nm), and all transfer transistors (TXs) have to be opened/closed (i.e., turned on/off) at the same time. Thus, for an array of 400×250 transfer transistors, each TX having a size of 0.1 µm$^2$, the total capacitance is 5 pF. Thus, in the depicted example, L needs to be 160 nH to achieve 250 MHz frequency of switching oscillation between TX1 and TX2. However, one of ordinary skill in the art having the benefit of the present disclosure will appreciate that these parameters may change depending on device dimensions and material selection.

Figure 2C:
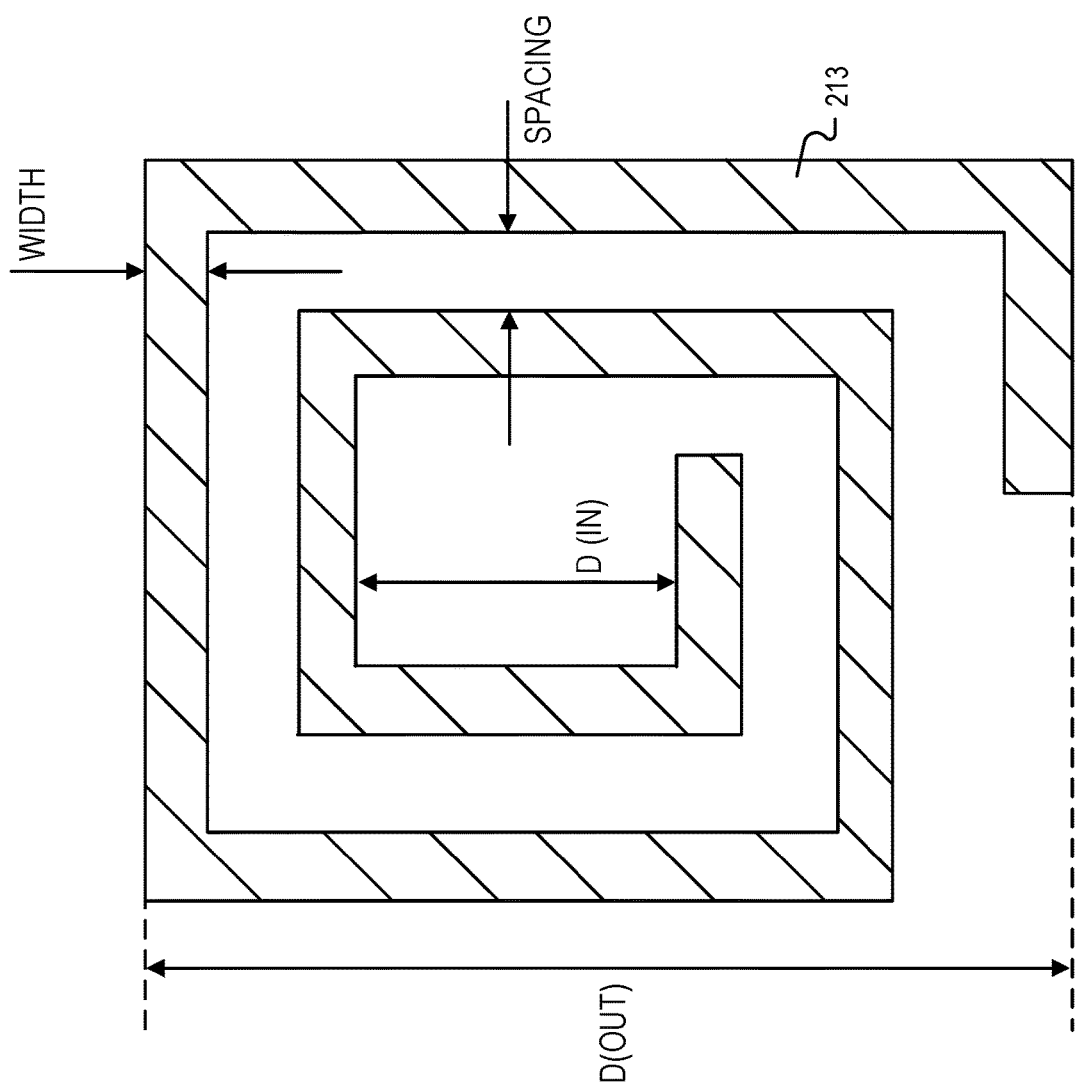
FIG. 2C shows an example schematic for the inductor of FIG. 2B, in accordance with the teachings of the present disclosure.

FIG. 2C shows an example schematic for the inductor of FIG. 2B, in accordance with the teachings of the present disclosure. In the depicted example, inductor 213 includes a metal coil that is substantially planar (e.g., existing in a single plane in a cross section of the device). As shown in the depicted example, the metal coil forms concentric substantially rectangular shapes and is a continuous coil. As illustrated in FIG. 2B, the inner end of the coil may be coupled to the gate of the first transfer transistor and the outer end of the coil may be coupled to the gate of the second transfer transistor or vice versa.

In the depicted example, assuming ~250 MHz operation, D(OUT) may be 100 µm, D(IN) may be 20.8 µm, the width may be less than 1 µm (e.g., 0.4 µm), the spacing may be less than 1 µm (e.g., 0.4 µm), and there may be 25 or more turns (e.g., 50 turns—loops of the coil). One of skill in the art having the benefit of the present disclosure will appreciate that only a small number of turns are depicted for exemplary purposes because more turns are redundant and not amenable to illustration.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A sensor, comprising:
   a photodiode disposed in a semiconductor material to receive light and convert the light into charge;
   a first floating diffusion coupled to the photodiode to receive the charge;
   a second floating diffusion coupled to the photodiode to receive the charge;
   a first transfer transistor coupled to transfer the charge from the photodiode into the first floating diffusion;
   a second transfer transistor coupled to transfer the charge from the photodiode into the second floating diffusion; and
   an inductor coupled between a first gate terminal of the first transfer transistor and a second gate terminal of the second transfer transistor, wherein the inductor, the first gate terminal, and the second gate terminal form a resonant circuit.

2. The sensor of claim 1, wherein the inductor applies a first oscillating voltage to the first gate terminal and a second oscillating voltage to the second gate terminal, and wherein the first oscillating voltage applied to the first gate terminal is 180 degrees out of phase from the second oscillating voltage applied to the second gate terminal.

3. The sensor of claim 2, wherein the inductor applies the first oscillating voltage to the first gate terminal and the second oscillating voltage to the second gate terminal at a frequency of greater than 100 MHz.

4. The sensor of claim 1, wherein the inductor is disposed in a logic wafer coupled to a non-illuminated side of the semiconductor material.

5. The sensor of claim 4, wherein the inductor includes a metal coil that is substantially planar.

6. The sensor of claim 5, wherein the metal coil forms concentric substantially rectangular shapes.

7. The sensor of claim 5, wherein the metal coil has a spacing between windings of less than 1 µm, and a winding width of less than 1 µm.

8. The sensor of claim 5, wherein the metal coil has 25 or more windings.

9. The sensor of claim 5, wherein the outer diameter of the metal coil is greater than 10 µm.

10. The sensor of claim 1, wherein the photodiode includes a single photon avalanche photodiode (SPAD).

11. A time-of-flight (TOF) sensor system, comprising:
    a light emitter coupled to emit light; and
    a plurality of pixels disposed in a semiconductor material and arranged into an array to receive the light, wherein each pixel includes:
    a photodiode disposed in a semiconductor material to receive light and convert the light into charge;
    a first floating diffusion coupled to the photodiode to receive the charge;
    a second floating diffusion coupled to the photodiode to receive the charge;
    a first transfer transistor coupled to transfer the charge from the photodiode into the first floating diffusion;
    a second transfer transistor coupled to transfer the charge from the photodiode into the second floating diffusion; and
    an inductor coupled between a first gate terminal of the first transfer transistor and a second gate terminal of the second transfer transistor, wherein the inductor, the first gate terminal, and the second gate terminal form a resonant circuit.

12. The TOF sensor system of claim 11, further comprising readout circuitry coupled to readout the charge from the first floating diffusion and the second floating diffusion and convert the charge into data representative of the charge.

13. The TOF sensor system of claim 12, further comprising a controller coupled to the readout circuitry to receive the data, wherein the controller includes logic that when executed by the controller causes the TOF sensor system to perform operations comprising:

emitting the light from the light emitter;

receiving the light with the photodiode; and calculating, based on the data, a time-of-flight for the light to be emitted from the light emitter, travel to an object, and return to an array.

14. The TOF sensor system of claim 13, wherein the controller further includes logic that when executed by the controller causes the system to perform operations comprising:

calculating a distance to the object from the TOF sensor system based on the time-of-flight.

15. The TOF sensor system of claim 11, wherein the inductor applies a first oscillating voltage to the first gate terminal and a second oscillating voltage the second gate terminal, and wherein the first oscillating voltage applied to the first gate terminal is 180 degrees out of phase from the second oscillating voltage applied to the second gate terminal.

16. The TOF sensor system of claim 14, wherein the inductor applies the first oscillating voltage to the first gate terminal and the second oscillating voltage to second gate terminal at a frequency of greater than 100 MHz.

17. The TOF sensor system of claim 11, wherein the inductor is disposed in a logic wafer coupled to a non-illuminated side of the semiconductor material.

18. The TOF sensor system of claim 17, wherein the inductor includes a metal coil that is substantially planar.

19. The sensor of claim 18, wherein the metal coil has 25 or more windings.

20. The TOF sensor system of claim 11, wherein the photodiode includes a single photon avalanche photodiode (SPAD).

* * * * *